Figure 1:
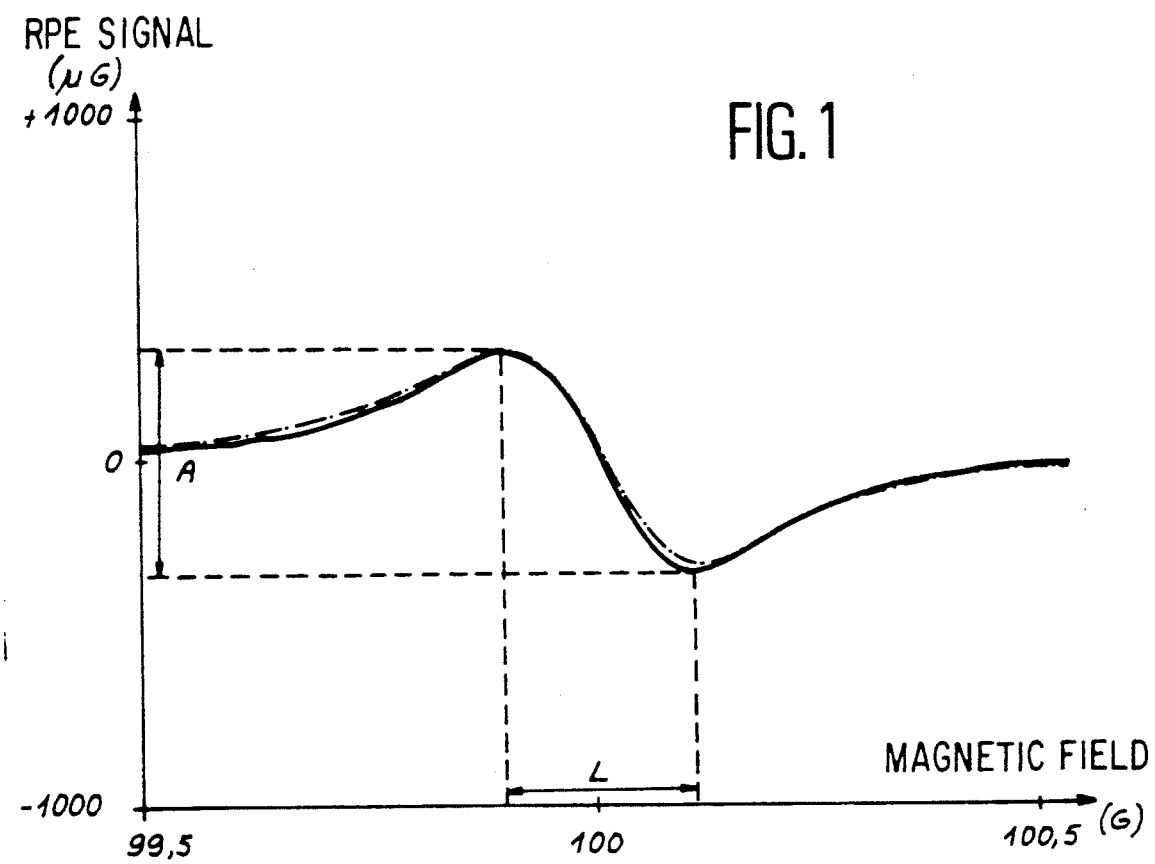

United States Patent [19]

Theurel et al.

[11] Patent Number: 5,327,084
[45] Date of Patent: Jul. 5, 1994

[54] ORGANIC MATERIAL USABLE IN A MAGNETOMETER AND PROBE FOR AN ELECTRON PARAMAGNETIC RESONANCE (EPR) MAGNETOMETER USING SAID MATERIAL

[75] Inventors: Laurence Theurel, Grenoble; Medhi Moussavi, Saint Egréve; Jean-Claude Marchon, St. Vincent de Mercuze, all of France

[73] Assignees: Commissariat a l'Energie Atomique; Centre National de la Recherche Scientifique, both of Paris, France

[21] Appl. No.: 28,223

[22] Filed: Mar. 9, 1993

[30] Foreign Application Priority Data

Mar. 11, 1992 [FR] France ............... 92 03011

[51] Int. Cl.$^5$ ............................................. G01V 3/00
[52] U.S. Cl. ................................................... 324/301
[58] Field of Search ............... 324/300, 301, 302, 307, 324/318, 322; 106/419; 528/230; 428/332

[56] References Cited

U.S. PATENT DOCUMENTS

| | | | |
|---|---|---|---|
| 4,579,594 | 4/1986 | Nanao et al. | 428/332 |
| 4,668,299 | 5/1987 | Nanao et al. | 106/419 |
| 4,954,607 | 9/1990 | Otani et al. | 528/230 |
| 5,159,269 | 10/1992 | Moussavi | 324/301 |

FOREIGN PATENT DOCUMENTS

| | | |
|---|---|---|
| 0451055 | 10/1991 | European Pat. Off. . |
| 2631958 | 12/1989 | France . |
| 2648457 | 12/1990 | France . |
| 2225015 | 5/1990 | United Kingdom . |

OTHER PUBLICATIONS

Review of Scientific Instruments, vol. 62, No. 3, Mar. 1, 1991, pp. 685-694, D. Duret, et al., "A New Ultra Low-Field ESR Spectrometer".
Journal of Physics E: Scientific Instruments, vol. 22, No. 5, May 1, 1989, pp. 321-324, H. Gebhardt, et al., "ESR Gaussmeter For Low-Field Applications".
Applied Physics A. Solids and Surfaces, vol. 30, No. 4, Apr. 1, 1983, pp. 227-231, E. Dormann, et al., "Gaussmeter Application of an Organic Conductor".

Primary Examiner—Michael J. Tokar
Attorney, Agent, or Firm—Oblon, Spivak, McClelland, Maier & Neustadt

[57] ABSTRACT

The invention relates to an organic material (5) usable in an electron paramagnetic resonance (EPR) magnetometer, as well as to a probe (3) using said material.

The object of the invention is to provide a material simultaneously having a limited line width (EPR), good temperature characteristics and which does not react in the presence of water.

This object is achieved with the aid of a radical cation salt of formula $$(Ar)_2 \cdot {}^+X^-$$

in which Ar represents an aromatic hydrocarbon, which is either unsubstituted or substituted by at least one element chosen from within the group constituted by halogen atoms or alkyl and alkoxy radicals and $X^-$ is an anion chosen from among $TeOF_5^-$ or $SeOF_5^-$.

4 Claims, 2 Drawing Sheets

ORGANIC MATERIAL USABLE IN A MAGNETOMETER AND PROBE FOR AN ELECTRON PARAMAGNETIC RESONANCE (EPR) MAGNETOMETER USING SAID MATERIAL

The present invention relates to an organic material usable in a magnetometer, as well as to an electron paramagnetic resonance magnetometer probe using said material.

(EPR) magnetometers make it possible to measure extremely low magnetic field values, which are generally equal to or below the intensity of the earth's field. These magnetometers function with the aid of a substance having an electron magnetic moment.

This substance must have a limited EPR line width in order to permit precise measurements with the magnetometer probe. Thus, it is known that the sensitivity of the magnetometer is inversely proportional to the cube of the width of the EPR line of the material.

The prior art discloses radical cation salts of formula $(Ar)_2 \cdot {}^+ X^-$, in which Ar represents an aromatic hydrocarbon and X an anion and which have an adequate electron magnetic moment to be used in magnetometer probes. These radical materials are prepared by the following electrochemical reaction:

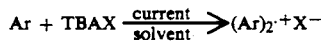

in which TBA stands for tetrabutyl ammonium and Ar and X have the meanings given hereinbefore.

From FR-A-2,631,958 is already known a radical cation salt of formula $(Ar)_2 \cdot {}^+ X^-$, in which Ar stands for tetrahydro-1,2,7,8-cyclopenta [cd; lm]-perylene and X is a hexafluoroarsenate ($AsF_6$) or preferably a hexafluorophosphate ($PF_6^-$). These cation salts are solvated, i.e. they contain x $CH_2Cl_2$ solvent molecules per $(Ar_2)PF_6$ molecule. These salts suffer from a certain number of disadvantages. Thus, the EPR magnetometer probe can be used up to temperatures exceeding ambient temperature, i.e. approximately 450° C. Therefore the radical materials used in said probe must have good temperature characteristics, so that the performance characteristics do not vary as a function thereof. However, in the case of solvated salts, their synthesis is not reproducible as a result of the variable number of included $CH_2Cl_2$ solvent molecules. The characteristics of the radical materials obtained are dependent on the number of solvent molecules and therefore the electrocrystallization conditions during their production and in particular the temperature. In order to obtain stable performance characteristics, it is consequently necessary to anneal the material at approximately 60° C. for 2 hours. This annealing procedure is described in the aforementioned document and serves to eliminate the solvent in the crystal lattice. This annealing also makes it possible to reduce the EPR line width. Without said annealing, the characteristics of the probe would be liable to vary with its temperature of use.

In addition, FR-A-2,648,457 discloses a radical cation salt of formula $(FA)_2 \cdot {}^+ PF_6^-$, in which FA represents fluoranthene. This radical cation is not solvated and has a very fine EPR line and the cation does not require annealing. However, it is very unstable, even at ambient temperature. Thus, in the presence of water, even if the latter is only in trace state, it decomposes in accordance with the following reaction diagram:

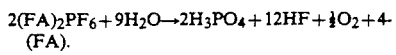

In this reaction diagram, FA stands for fluoranthene.

This reaction takes place even if the water is only present in trace form, more particularly in the form of inclusions in the crystals produced during the electrocrystallization of the fluoranthene hexafluorophosphate by conventional processes.

The prejudicial effects of this decomposition reaction are the production of phosphoric and hydrofluoric acids, which accelerate the degradation of the radical by catalytic effect and the widening of the EPR line of the salt due to the giving off of oxygen, because there is a coupling between the electron spin of the radical and the paramagnetic oxygen.

These effects lead to the formation of generally white fluoranthene microcrystals which, on deposition on the surface of the crystals of the radical cation salt (black or violet) give them a grey colour. Moreover, the giving off of hydrofluoric acid (white smoke) makes the walls of the EPR magnetometer probe opaque, because they are generally made from glass, which is attacked by the hydrofluoric acid.

This degradation is due to the considerable reactivity of the $PF_6^-$ anion with respect to water. Therefore the radical cation $(Fa)_2 \cdot {}^+ PF_6^-$ must be kept cold and in the presence of a material able to absorb water such as a zeolite molecular sieve, as described in FR-A-2,648,457.

Therefore the two types of radical cations described hereinbefore are not satisfactory, because they cause solvation or instability problems. These difficulties make them difficult to use in an EPR magnetometer probe and makes it necessary for the manufacturer to carry out supplementary stages during the preparation of said probe, namely the annealing of the cation or the addition of a material able to absorb water.

The object of the present invention is to obviate these disadvantages.

Therefore the invention relates to an organic material usable in an electron paramagnetic resonance magnetometer.

According to the features of the invention, said material is constituted by a radical cation salt of formula: $(Ar)_2 \cdot {}^+ X^-$ in which Ar stands for an aromatic hydrocarbon, which is unsubstituted or is substituted by at least one element chosen from within the group constituted by halogen atoms or alkyl and alkoxy radicals and $X^-$ is an anion chosen from among $TeOF_5^-$ or $SeOF_5^-$.

Advantageously, Ar stands for an aromatic hydrocarbon chosen from among naphthalene, fluoranthene, perylene, pyrene or triphenylene.

This radical material is stable and unsolvated and has a good temperature behaviour. It has a minimum EPR line width of 100 mG and a line width of 205 mG at 280 mHz for the maximum signal gradient. Consequently it can be used in an EPR magnetometer probe. Thus, in the prior art, the instability of the radical $(FA)_2 PF_6$ was due to the high reactivity of $PF_6^-$ with respect to water. The two anions selected here are less reactive than $PF_6$, but still have properties very close to it with regards to the size, octahedral geometry and electronegativity, so as to maintain the same stoichiometry and geometry as in the $(Ar)_2^+ PF_6^-$ cation. The combination using as the anion pentaorthofluorotellurate (TeOF$_5^-$), referred to as Teflate (registered trademark) is preferred. This anion is described in the article by S. H. Strauss and K. D. Abney, Inorg. Chem. 1984, 23, pp. 515-516.

These properties are very close to those of PF$_6^-$, as can be gathered from the following table 1.

TABLE 1

|  | P |  | Te |
|---|---|---|---|
| Ion radius (Å) | 0.35 |  | 0.56 |
| Electronegativity | 2.1 |  | 2.1 |
| Distance between atoms (Å) | P—F 1.9 | Te—F | 1.85 |
|  |  | Te—O | 1.79 |

Finally, the invention also relates to a probe for an electron paramagnetic resonance (EPR) magnetometer having a tube containing a substance which has an electron magnetic moment chosen from among the organic materials described hereinbefore.

The invention is described in greater detail hereinafter relative to non-limitative embodiments and with reference to the attached drawings, wherein show:

FIG. 1 a graph illustrating the EPR spectrum of one of the organic materials according to the invention, respectively immediately after preparation and after annealing.

Figure 2:
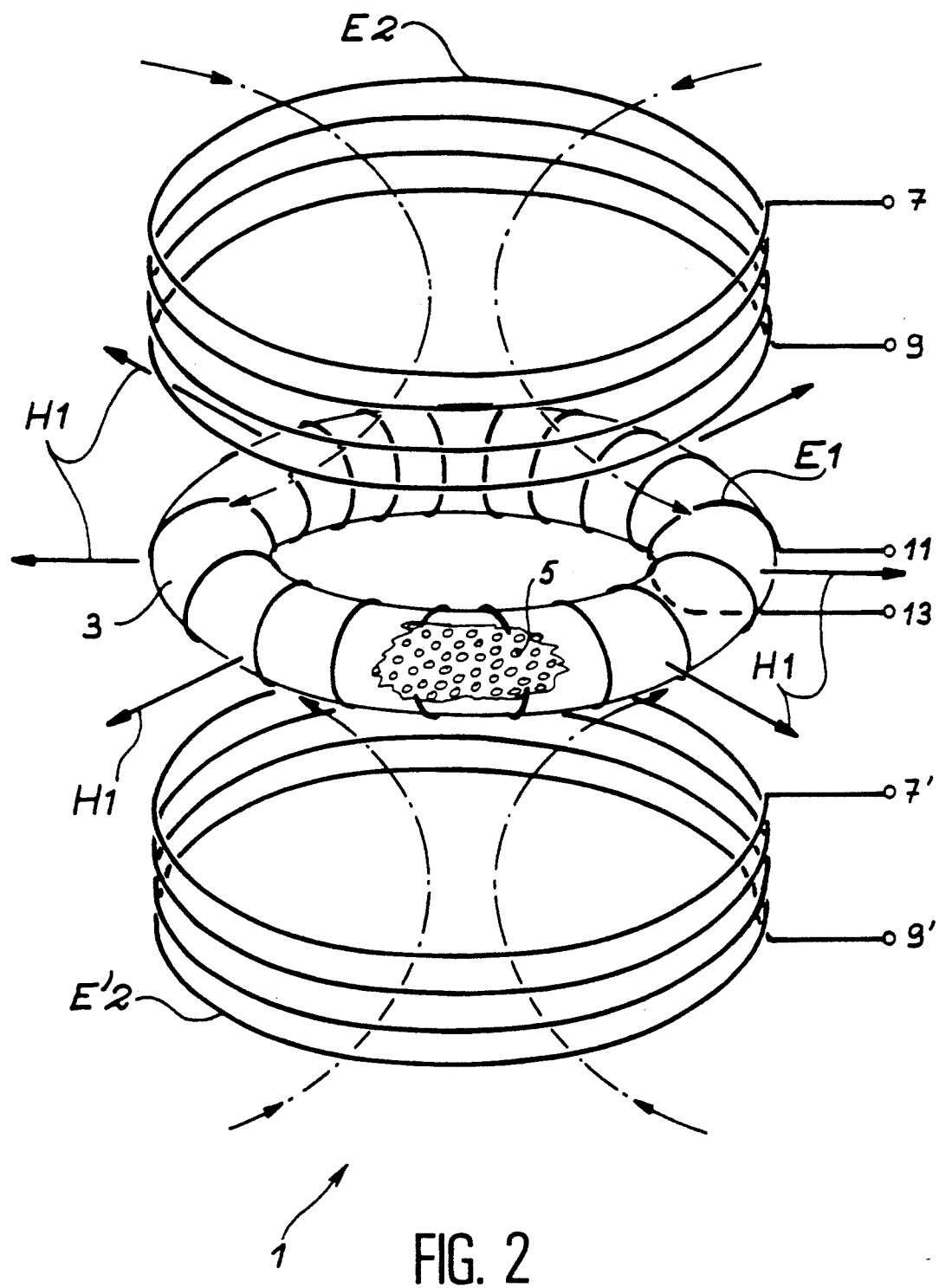

FIG. 2 diagrammatically the toroidal probe of an EPR magnetometer containing the organic material (radical cation salt) according to the invention.

Figure 3:
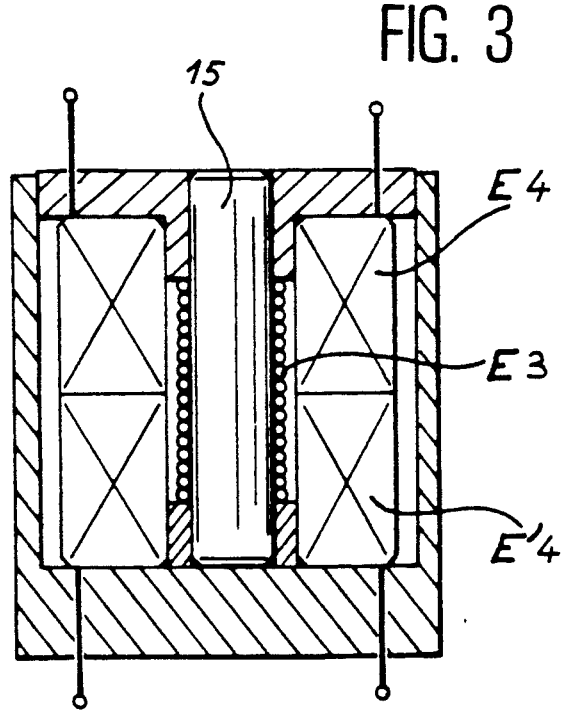

FIG. 3 similar to FIG. 2, but with a cylindrical probe.

Among the radical cation salts according to the invention, the cation (Ar)$_2$TeOF$_5$ and its preparation will now be described.

The radical cation (Ar)$_2$TeOF$_5$ is prepared according to the following electrochemical reaction:

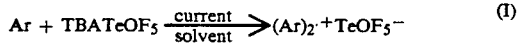

(I)

in which Ar represents an aromatic hydrocarbon, which is unsubstituted or substituted by at least one element chosen from within the group constituted by halogen atoms or alkyl and alkoxy radicals and TBA stands for tetrabutyl ammonium.

The TBATeOF$_5$ is prepared in two stages according to the following reaction diagram:

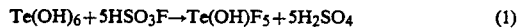

(1)

(2)

The first synthesis reaction (1) is described in the article by S. Fladky, Inorg. Synth, 1986, 24, pp. 33-36. The second synthesis reaction (2) is described in the article by S. H. Strauss, K. D. Abney and O. P. Anderson, Inorg. Chem., 1986, 25, pp. 2806-2812.

The TBATeOF$_5$ salt obtained is purified by recrystallization. In reaction (I) the solvent used is dichloromethane, purified prior to use by the process described in the literature (Purification of Laboratory Chemicals, D. D. Perrin and W. L. F. Armarego, Pergamon Press, 1988, 145).

A specific example of the synthesis of perylene pentaorthofluorotellurate will now be described.

EXAMPLE

Electrocrystallization takes place protected from light at a temperature of −80° C., in a double compartment cell like that described in FR-A-2,648,457. The current density applied is approximately 4 μA/cm$^2$. The current is applied to the terminals of platinum electrodes immersed in a solution of 40 mg of perylene and 200 mg of tetrabutyl ammonium pentaorthofluorotellurate, present in each compartment. After two days recovery takes place by filtration of the crystals of (Pe)$_2$TeOF$_5$ (Pe representing perylene) formed and after washing with dichloromethane (3×50 ml), 50 mg of crystals in the form of black needles are obtained.

In addition, two EPR spectra are formed corresponding to the recently synthesized radical product and to the same product in the annealed form. These results are illustrated in FIG. 1 where the radical cation salt is (Pe)$_2$TeOF$_5$. The continuous line curve illustrates the EPR spectrum obtained with a recently synthesized salt and the mixed line curve the EPR spectrum obtained with a salt annealed at 80° C. for 1 hour. The abscissa axis represents the magnetic field in Gauss and the ordinate axis the amplitude of the EPR signal in μGauss.

At a frequency of 280 MHz, the EPR magnetic field is 100 Gauss. For observing the EPR signal, there is a scan of the magnetic field around the value of 100 Gauss (here 99.5 to 100.5G).

This salt has a line width L of 205 mG at 280 MHz for maximum signal gradient conditions. Its peak-to-peak amplitude A is 638 μG. These two substantially identical EPR spectra illustrate the perfect stability of the EPR characteristics of this novel product.

More specifically, the value of the amplitude of the EPR signal in μG has been reduced to G so as to be able to calculate the gradient of the signal between the two peaks and obtain a unit-free value. Thus, for the continuous line curve, the gradient has a value of 21879.10$^{-6}$ and for the mixed line curve a value of 20197.10$^{-6}$. This very small gradient variation illustrates the stability of the product and therefore its performance characteristics for its use in magnetometry.

For comparison, tetrahydro-1,2,7,8-cyclopentaperylene hexafluorophosphate described in FR-A-2,631,958 degrades as from 80° C.

The radical cation salts obtained according to the invention are then introduced into the probe of an EPR magnetometer according to the invention. A first embodiment thereof is diagrammatically shown in FIG. 2.

The magnetometer comprises a probe 1 and electronic means, which are not shown in FIG. 2. The probe 1 is formed by a toroidal tube 3 filled with a radical cation salt 5 chosen from among those according to the invention. This tube, which need not be made gas-tight, can be made from glass or some other material, e.g. a plastic material, which does not give a parasitic EPR signal. This tube 3 is surrounded by a first winding E$_1$ wound around the glass wall and able to produce a voltage due to the detected magnetic flux variation. Two windings E$_2$ and E'$_2$ constituted by Helmholtz coils are associated with the tube 3 on either side of its median plane. These coils are coaxial to the tube 3, but are supplied in such a way that the magnetic fields which they create are in opposition. This leads to field lines forming in the median plane of the tube 3 a radial distribution field H$_1$. The connections 7,9 and 7',9' make it possible to supply current to the coils E$_2$' and E'$_2$, whilst the connections 11,13 make it possible to sample the signal leaving the winding E$_1$. The electronic means make it possible to measure the frequency of the signal sampled at the connections 11,13 and also supply the magnetic field $H_1$.

The probe illustrated in FIG. 2 is only an exemplified embodiment. The radical cation salt according to the invention can also be used in the probe of a magnetometer having a different structure, said probe being illustrated in FIG. 3. This probe is constituted by a cylindrical tube 15 filled with a radical cation salt according to the invention. The tube 15 is surrounded by a first winding $E_3$ wound around the tube and able to produce a voltage due to a detected magnetic flux variation. Two windings $E_4$ and $E'_4$ constituted by Helmholtz coils are associated with the tube 15 and make it possible to create a rotary magnetic field.

We claim:

1. Organic material usable in an electron paramagnetic resonance magnetometer, characterized in that it is constituted by a radical cation salt of formula:

$$(Ar)_2 \cdot {}^+ X^-$$

in which Ar represents an aromatic hydrocarbon, which is unsubstituted or substituted by at least one element chosen from within the group constituted by halogen atoms or alkyl and alkoxy radicals and $X^-$ is an anion chosen from among $TeOF_5^-$ or $SeOF_5^-$.

2. Organic material according to claim 1, characterized in that Ar represents an aromatic hydrocarbon chosen from among naphthalene, fluoranthene, perylene, pyrene or triphenylene.

3. Organic material according to claim 1, characterized in that Ar represents perylene and $X^-$ $TeOF_5^-$.

4. Electron magnetic resonance (EPR) magnetometer probe comprising a tube (3,15) containing a substance (5) having an electron magnetic moment, characterized in that said substance (5) is the organic material according to one of the claims 1 to 3.

* * * * *

UNITED STATES PATENT AND TRADEMARK OFFICE
CERTIFICATE OF CORRECTION

PATENT NO. :   5,327,084
DATED      :   July 5, 1994
INVENTOR(S):   Laurence THEUREL, et al.

It is certified that error appears in the above-indentified patent and that said Letters Patent is hereby corrected as shown below:

On the title page, Item [30], the Foreign Application Priority
   Date should read as follows:

--Mar. 13, 1992--

Signed and Sealed this

Twenty-fifth Day of October, 1994

Attest:

BRUCE LEHMAN

*Attesting Officer*      *Commissioner of Patents and Trademarks*